United States Patent
Bravo et al.

(10) Patent No.: US 10,078,107 B2
(45) Date of Patent: Sep. 18, 2018

(54) WAFER LEVEL ELECTRICAL TEST FOR OPTICAL PROXIMITY CORRECTION AND/OR ETCH BIAS

(71) Applicant: GLOBALFOUNDRIES Inc., Grand Cayman (KY)

(72) Inventors: Jaime Bravo, Berkeley, CA (US); Vikrant Chauhan, Clifton Park, NY (US); Ryan Scott Smith, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 182 days.

(21) Appl. No.: 14/924,439

(22) Filed: Oct. 27, 2015

(65) Prior Publication Data
US 2017/0115337 A1    Apr. 27, 2017

(51) Int. Cl.
*G01R 31/26* (2014.01)
*G01R 31/28* (2006.01)

(52) U.S. Cl.
CPC ..... *G01R 31/2607* (2013.01); *G01R 31/2601* (2013.01); *G01R 31/2831* (2013.01); *G01R 31/2884* (2013.01)

(58) Field of Classification Search
None
See application file for complete search history.

(56) References Cited

U.S. PATENT DOCUMENTS

| 4,782,288 A * | 11/1988 | Vento .................. G01R 17/02 324/750.3 |
| 6,429,667 B1 | 8/2002 | Ausschnitt et al. |
| 7,009,268 B2 * | 3/2006 | Yang .................. B82Y 15/00 257/467 |
| 2004/0121509 A1 * | 6/2004 | Meyer ................ H01L 21/326 438/99 |
| 2010/0190278 A1 | 7/2010 | Zingg et al. |
| 2013/0249574 A1 * | 9/2013 | House ............... G01N 27/3278 324/706 |

FOREIGN PATENT DOCUMENTS

| TW | 200537114 A | 4/2007 |
| TW | 200726987 A | 7/2007 |

OTHER PUBLICATIONS

Examination Report from the Intellectual Property Office, dated Jul. 17, 2017, and Search Report for Taiwan Patent Application No. 105123414, dated Jun. 27, 2017.

* cited by examiner

*Primary Examiner* — Paresh Patel
(74) *Attorney, Agent, or Firm* — Heslin Rothenberg Farley & Mesiti P.C.; Stephen Scuderi

(57) ABSTRACT

Three reference resistors of the same resistance and a test structure are connected in a circuit having a Wheatstone Bride design. The circuit is electrically coupled between an input and ground. A voltage applied at the input resulting in an electrical characteristic difference between two midpoints of the circuit indicates the need for corrective action with respect to a design of the test structure for either OPC or etch bias.

11 Claims, 3 Drawing Sheets

WAFER LEVEL ELECTRICAL TEST FOR OPTICAL PROXIMITY CORRECTION AND/OR ETCH BIAS

BACKGROUND OF THE INVENTION

Technical Field

The present invention generally relates to verifying an integrated circuit design. More particularly, the present invention relates to wafer-level electrical testing of a circuit for optical proximity correction and/or etch bias.

Background Information

In circuit design, the controlling factor determining the resistance of a line is its width, what is known as the critical dimension. Currently, integrated circuit fabrication includes failure analysis, the results of which provide useful, but limited, information (i.e., failure or success).

Thus, a need exists for more robust testing providing more useful information with regard to fundamental patterns in circuit design and process response to those patterns.

SUMMARY OF THE INVENTION

The shortcomings of the prior art are overcome and additional advantages are provided through the provision, in one aspect, of a method of identifying and making necessary local adjustments to an integrated circuit design. The method includes providing at least one semiconductor die, and for each die, electrically connecting three reference resistors having a same designed resistance to a test structure to be tested in a circuit having a Wheatstone Bridge design, the circuit electrically being coupled between an input and ground, and the test structure is an integrated circuit having a circuit design. The method further includes testing the circuit design of the integrated circuit, the testing including applying a voltage across the input, measuring for an electrical difference between two midpoints of the circuit having the Wheatstone Bridge design, the electrical characteristic difference indicating a need for one or more corrective actions to be applied to the circuit design. The method further includes applying the one or more corrective actions by modifying the circuit design to prevent the electrical characteristic difference.

In accordance with another aspect, a test structure is provided. The circuit includes three reference resistors having equal designed resistances, and at least one test structure having a test resistance, the at least one test structure including at least one integrated circuit. The three reference resistors and the test structure are electrically connected in a circuit having a Wheatstone Bridge design, the circuit electrically coupled between an input and ground. When an applied voltage across the input results in an electrical characteristic difference between two midpoints of the integrated circuit, one or more corrective actions for the design of the at least one test structure are indicated.

These, and other objects, features and advantages of this invention will become apparent from the following detailed description of the various aspects of the invention taken in conjunction with the accompanying drawings.

DETAILED DESCRIPTION OF THE INVENTION

Figure 1:
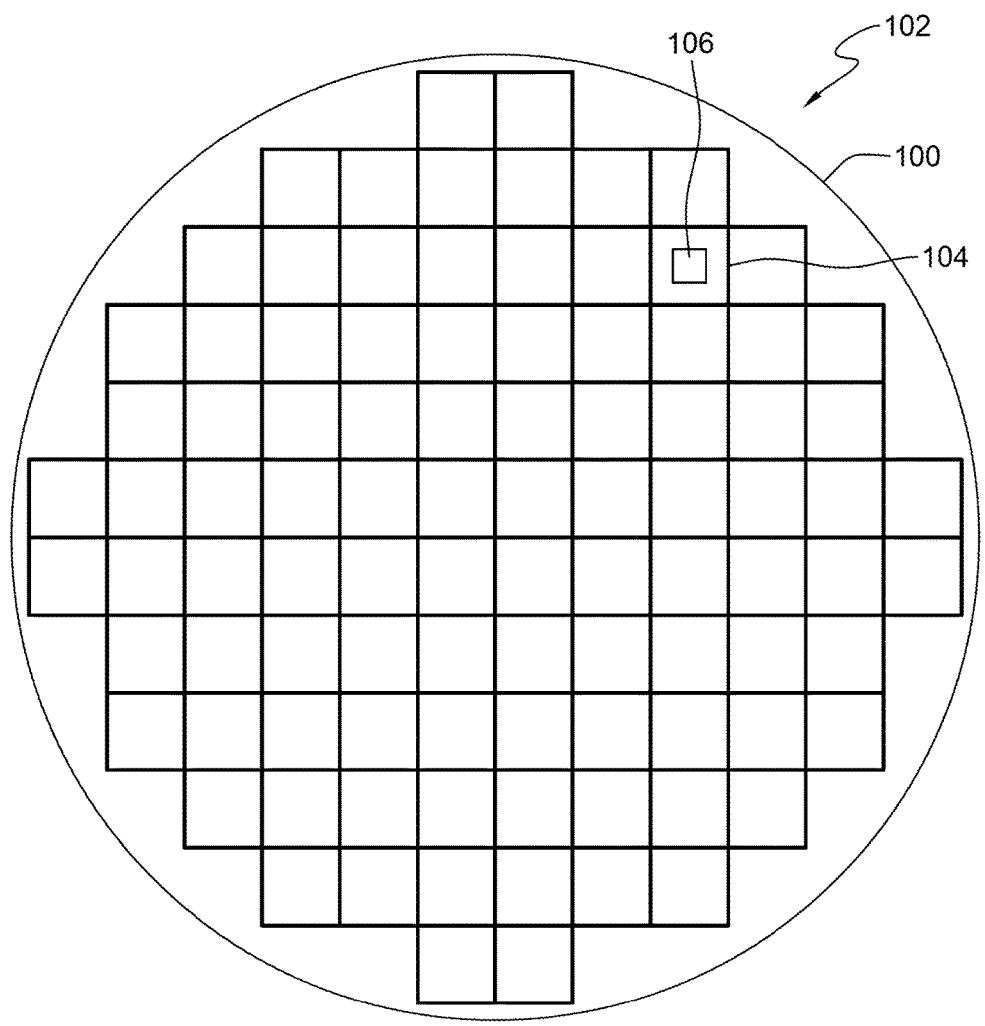
FIG. 1 depicts one example of a semiconductor wafer with multiple dies thereon, each die including a test structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus three percent of the value. Also, unless otherwise specified, a given aspect of semiconductor fabrication described herein may be accomplished using conventional processes and techniques, where part of a method, and may include conventional materials appropriate for the circumstances, where a semiconductor structure is described.

Reference is made below to the drawings, which are not drawn to scale for ease of understanding, wherein the same reference numbers are used throughout different figures to designate the same or similar components.

The present invention allows for inline electrical integrated circuit testing that provides more information than conventional failure analysis that is statistically significant. The testing monitors optical proximity correction (OPC) target and etch biases (i.e., line density differences), which may include complex patterns, through the use of wafer level electrical tests (WET).

In addition, the present invention enables the characterization of resistance differences arising from OPC adjustments or variations in space near the lines. The OPC and etch bias data can be provided for each die of a semiconductor wafer, allowing for the creation of yield and OPC models. In addition, information regarding semiconductor quality for etch bias can be obtained. Consistency of resistance per length for a given line width of integrated circuits can be obtained, ensuring specifications for all line pitches are met. The data will also be useful for preventing unanticipated etch biases from creating too thin of a line or too thin of a space.

The benefits of the present invention include testing for etch-to-OPC bias on all lots using WET, and determining for every lot whether the underlying OPC process etch bias assumptions are correct. Also, the present invention allows monitoring of the etch-to-OPC bias to proactively react to any unintentional changes in the process. Although space in the prime or frame area of the wafer is needed, the positive aspects far outweigh the loss of wafer real estate.

The testing of the present invention can be implemented with currently available technology and equipment; no new infrastructure would be needed.

The reference resistors in the circuit with Wheatstone Bridge design is the OPC control structure, while the test structure having a test "resistance" is the anchor pitch design processed through typical OPC steps, i.e., minimum line width and minimum line space.

For etch bias, the reference resistors are the anchor pitch structure processed through typical OPC steps, while the test structure is one of the through pitch macros processed through typical OPC steps.

FIG. 1 depicts one example of a semiconductor wafer 100 with multiple dies 102 thereon, each die (e.g., die 104) including a test structure 106, in accordance with one or more aspects of the present invention.

The starting structure may be conventionally fabricated, for example, using known processes and techniques. Further, unless noted otherwise, conventional processes and techniques may be used to achieve individual steps of the fabrication process of the present invention.

In one example, wafer 100 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Wafer 100 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
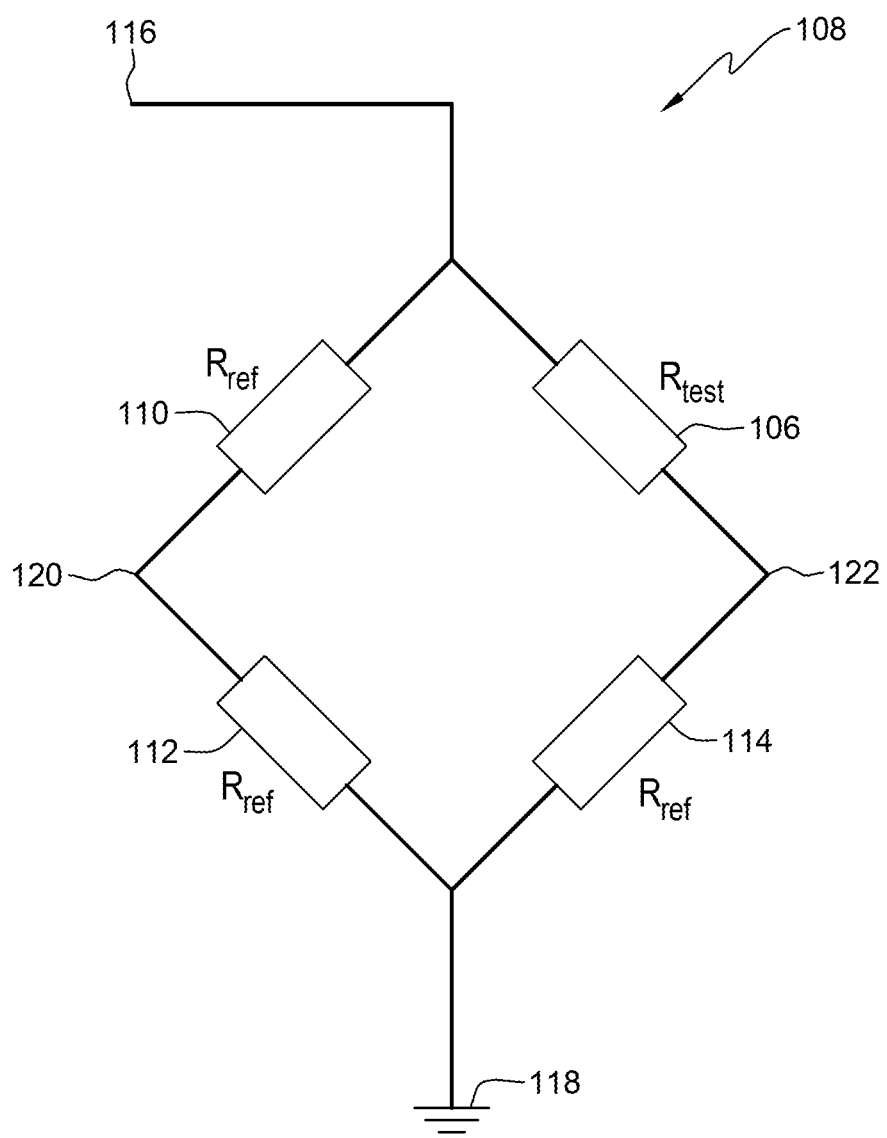
FIG. 2 depicts one example of a circuit structure, the structure including three resistors of a same resistance, and a test structure, the resistors and test structure electrically connected in a Wheatstone Bridge design between an input and ground.

FIG. 2 depicts one example of a circuit structure 108 to identify and make necessary local adjustments to an integrated circuit design, the circuit including three resistors 110, 112 and 114 having the same designed resistance, and a test structure 106, the resistors and test structure electrically connected in a Wheatstone Bridge design, and electrically coupled between an input 116 and ground 118.

Test structure 106 has a test resistance, and when a voltage is applied across the input 116, an electrical characteristic difference at midpoints 120 and 122 indicates corrective action for the design of the test structure is needed.

In one example, the input voltage may be about 0.9 volts to about 1 volt. The electrical characteristic may include, for example, a resistance or a voltage. For a voltage difference, if the sensitivity is $R_{TEST}-R_{REF} \sim 10^{-9}$ Ohms, and the tool sensitivity is $\Delta V/Vin \sim 10^{-9}$, where $\Delta V$ is a voltage difference between midpoints 120 and 122, then the detectability of the difference will be sensitive down to one nano-Ohm.

In one example, the corrective action may include an OPC adjustment in the design. The measured value used for OPC adjustments insures that resistance per length for a given line width meets specification for all line pitches used. In one example, for a 20 nm technology design, $R_{REF}$ each have a 64 nm pitch, and $R_{TEST}$ has a 32 nm wide line at a 90 nm pitch. Catastrophic OPC retargeting may be maintained or suppressed.

Figure 3:
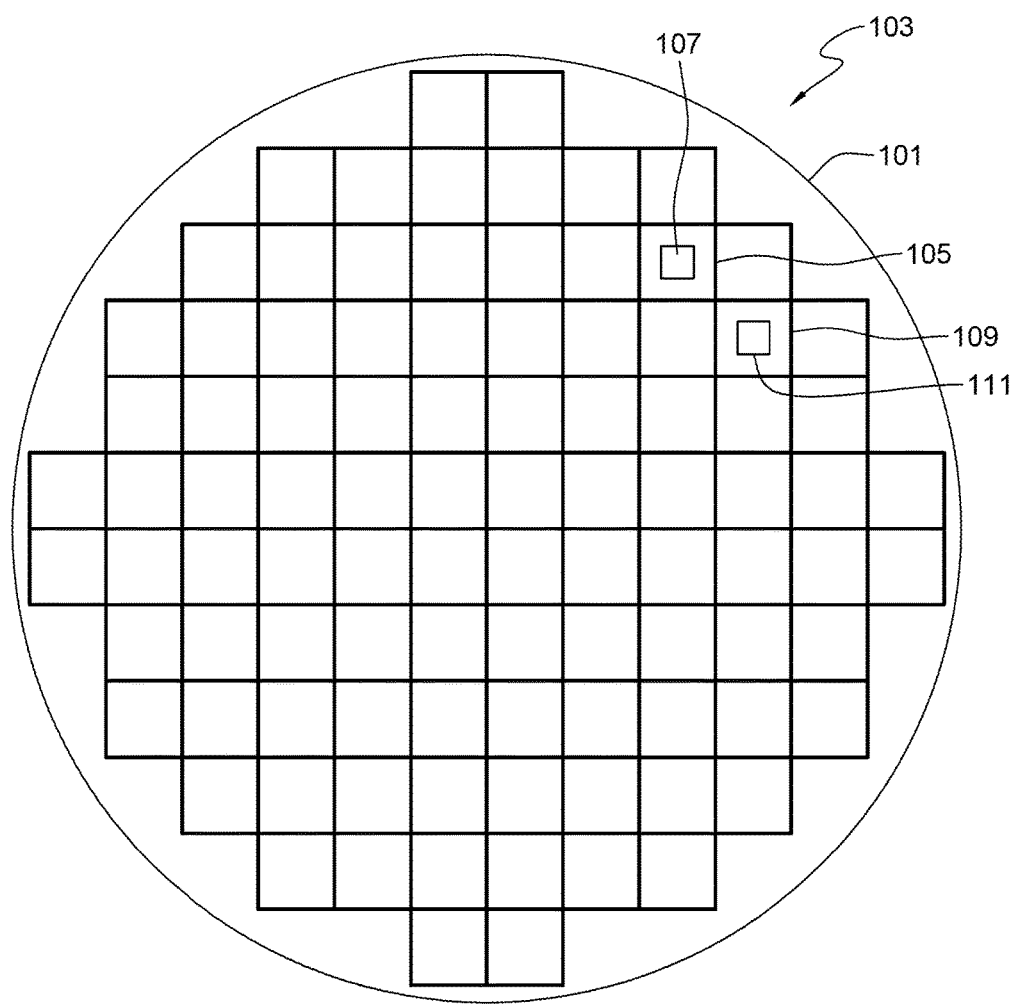
FIG. 3 depicts one example of a semiconductor wafer with multiple dies thereon, two dies each including a different test structure, in accordance with one or more aspects of the present invention.

FIG. 3 depicts one example of a semiconductor wafer 101 with multiple dies, e.g., dies 105 and 109 thereon, each of die 105 and 109 including different test structures 107 and 111, respectively, in accordance with one or more aspects of the present invention.

In a first aspect, disclosed above is a method of identifying and making necessary local adjustments to an integrated circuit design. The method includes providing semiconductor die(s), and for each die, electrically connecting three reference resistors having a same designed resistance to a test structure in a circuit having a Wheatstone Bridge design, the circuit electrically coupled between an input and ground. The method further includes applying a voltage across the input, and measuring for an electrical characteristic difference between two midpoints of the circuit, the electrical characteristic difference indicating a need for corrective action(s) to be applied to a design of the test structure.

In one example, the semiconductor die(s) may include, for example, dies on a semiconductor wafer, and the applying and measuring may be, for example, performed for each of the dies.

In one example, the electrical characteristic difference in the method of the first aspect may include, for example, a voltage difference.

In another example, the electrical characteristic difference in the method of the first aspect may include, for example, a resistance difference.

In one example, the reference resistors in the method of the first aspect may have, for example, a known optical proximity correction (OPC) bias, each test structure has an unknown OPC bias, and the corrective action(s) achieves a resistance per length for a given line width that meets specification for all line pitches used. In one example, the dies may have, for example, different test structures with different OPC biases.

In one example, there are at least two dies with at least two test structures (at least one structure on each die), and the test structures in the method of the first aspect may have, for example, a different through-pitch line spacing, and the corrective action(s) may include altering an etch bias of the design to substantially reduce or eliminate a difference (e.g., a difference of about two percent or less) in resistances of the test structures. In one example, the at least two test structures may have, for example, different line widths.

In one example, the corrective action(s) in the method of the first aspect may correct, for example, integrated circuit design at a pre-design stage of development.

In another example, the corrective action(s) in the method of the first aspect may correct, for example, integrated circuit design at a design stage of development.

In still another example, the corrective action(s) in the method of the first aspect may correct, for example, integrated circuit design at a post-design stage of development.

In a second aspect, disclosed above is an integrated circuit on a die. The integrated circuit includes three reference resistors having a same designed resistance, and at least one test structure having a test resistance. The reference resistors and the test structure(s) are electrically connected in a circuit having a Wheatstone Bridge design, the circuit electrically coupled between an input and ground, and when an applied voltage across the input results in an electrical characteristic difference between two midpoints of the integrated circuit, corrective action(s) for the design of the test structure(s) are indicated.

In one example, the electrical characteristic difference may include, for example, a voltage difference. In another example, the electrical characteristic difference may include, for example, a resistance difference.

In one example, the reference resistors in the circuit of the second aspect may have, for example, a known optical proximity correction (OPC) bias, each test structure may have, for example, an unknown OPC bias, and the corrective action(s) achieves a resistance per length for a given line width that meets specification for all line pitches used.

In one example, the circuit of the second aspect may be, for example, situated on die(s) of a semiconductor wafer.

In one example, the semiconductor wafer may include, for example, multiple dies, the reference resistors may have, for example, a known optical proximity correction (OPC) bias, each test structure may have, for example, an unknown OPC bias, and the corrective action(s) achieves a resistance per length for a given line width that meets specification for all line pitches used.

In one example, at least two of the multiple dies may have, for example, different test structures with different OPC biases.

In one example, at least two dies with at least two test structures in the second aspect that may have, for example, a different through-pitch line spacing, and the corrective action(s) may include OPC bias correction(s) to the design or, where drift has been observed, making change(s) to the fabrication process.

In one example, the at least two test structures may have, for example, different line widths.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing at least one semiconductor die;
   for each die, electrically connecting three reference resistors having a same designed resistance to a test structure to be tested in a circuit having a Wheatstone Bridge design, the circuit electrically coupled between an input and ground, wherein the test structure is an integrated circuit having a circuit design;
   testing the circuit design of the integrated circuit, wherein the testing comprises:
      applying a voltage across the input; and
      measuring for an electrical characteristic difference between two midpoints of the circuit having the Wheatstone Bridge design, the electrical characteristic difference indicating a need for one or more corrective actions to be applied to the circuit design; and
   applying the one or more corrective actions by modifying the circuit design to prevent the electrical characteristic difference.

2. The method of claim 1, wherein the at least one semiconductor die comprises a plurality of dies on a semiconductor wafer, and wherein the applying and measuring are performed for each of the plurality of dies.

3. The method of claim 1, wherein the electrical characteristic difference comprises a voltage difference.

4. The method of claim 1, wherein the electrical characteristic difference comprises a resistance difference.

5. The method of claim 1, wherein the reference resistors have a known optical proximity correction (OPC) bias, wherein each test structure has an unknown OPC bias, and wherein the one or more corrective actions achieves a desired resistance for the test structure.

6. The method of claim 5, wherein the at least one semiconductor die comprises at least two semiconductor dies having different test structures with different OPC biases.

7. The method of claim 1, wherein the at least one semiconductor die comprises at least two semiconductor dies having different test structures, and wherein the one or more corrective actions comprises altering an etch bias of the circuit design to substantially reduce or eliminate a difference in resistances of the different test structures.

8. The method of claim 1, wherein the one or more corrective actions correct integrated circuit design at a pre-design stage of development.

9. The method of claim 1, wherein the one or more corrective actions correct the circuit design at a design stage of development.

10. The method of claim 1, wherein the one or more corrective actions correct the circuit design at a post-design stage of development.

11. The method of claim 1, further comprising applying at least one of the one or more corrective actions to the circuit design of the integrated circuit.

\* \* \* \* \*